(12) United States Patent  
Ryu

(10) Patent No.: US 7,394,689 B2  
(45) Date of Patent: Jul. 1, 2008

(54) NAND FLASH MEMORY DEVICE HAVING SECURITY REDUNDANCY BLOCK AND METHOD FOR REPAIRING THE SAME

(75) Inventor: Kyung-Won Ryu, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/290,482

(22) Filed: Dec. 1, 2005

(65) Prior Publication Data

US 2006/0158933 A1    Jul. 20, 2006

(30) Foreign Application Priority Data

Jan. 14, 2005    (KR) .................... 10-2005-0003842

(51) Int. Cl.
*G11C 11/34* (2006.01)

(52) U.S. Cl. .................... 365/185.09; 365/200

(58) Field of Classification Search ............ 365/185.04, 365/185.09, 200
See application file for complete search history.

(56) References Cited

U.S. PATENT DOCUMENTS

| | | | | |
|---|---|---|---|---|
| 5,949,703 A | * | 9/1999 | Shibata et al. .............. | 365/103 |
| 6,002,620 A | * | 12/1999 | Tran et al. ................... | 365/200 |
| 6,154,398 A | * | 11/2000 | Cutter et al. ................ | 365/200 |
| 6,404,683 B1 | * | 6/2002 | Yumoto ....................... | 365/200 |
| 6,751,121 B2 | * | 6/2004 | Marotta .................. | 365/189.09 |
| 6,937,512 B2 | * | 8/2005 | Shibata et al. ......... | 365/185.04 |
| 2004/0255089 A1 | * | 12/2004 | Unno ......................... | 711/154 |
| 2006/0034136 A1 | * | 2/2006 | Abedifard ................... | 365/200 |
| 2006/0140026 A1 | * | 6/2006 | Ilkbahar et al. ............. | 365/200 |

FOREIGN PATENT DOCUMENTS

| | | |
|---|---|---|
| JP | 04-003399 | 1/1992 |
| JP | 05-074191 | 3/1993 |
| KR | 1020030025406 A | 3/2003 |
| WO | WO 96/15536 | 5/1996 |

\* cited by examiner

*Primary Examiner*—A. Zarabian
*Assistant Examiner*—Anthan T Tran
(74) *Attorney, Agent, or Firm*—Volentine & Whitt, PLLC

(57) ABSTRACT

In one aspect, a NAND flash memory device is provided which includes a plurality of main blocks for storing main data, a security block for storing security data, and a plurality of redundancy blocks each for being substituted in place of a failed main block, wherein at least one of the redundancy blocks may selectively substituted in place of a failed main block and a failed security block. In an alternative aspect, the NAND flash memory device a security redundancy block for being substituted in place of the security block in the event the security block fails.

4 Claims, 3 Drawing Sheets

NAND FLASH MEMORY DEVICE HAVING SECURITY REDUNDANCY BLOCK AND METHOD FOR REPAIRING THE SAME

BACKGROUND OF THE INVENTION

1. Field of the Invention

The present invention relates generally to a NAND flash memory device, and more specifically, the present invention relates to a NAND flash memory device having a security redundancy block, and to a method for repairing a NAND flash memory device have a defective security block.

A claim of priority is made to Korean Patent Application No. 2005-03842, filed on Jan. 14, 2005, the disclosure of which is hereby incorporated by reference in its entirety.

2. Description of the Related Art

Flash memory devices, called "Flash Electrically Erasable Programmable Read Only Memory" (Flash EEPROM) or "$E^2PROM$", are non-volatile memories which maintain stored data even in the absence of supplied power.

Generally, a NAND flash memory device has a plurality of memory cells that are configured in a string structure. The memory cell array of the NAND flash memory device includes a plurality of memory blocks, and each of the blocks defines a plurality of pages formed by a plurality of memory cells sharing one word line. For example, in conventional NAND flash memory devices, the cell array is formed by 1,024 or 2,048 blocks, each of the blocks has 16, 32, or 64 pages, and 512 bytes or 1 kilobyte of memory cells are connected to each of the pages. In NAND memory devices, erase operations are performed on a block-by-block basis, while read and write operations are performed on a page-by-page basis.

It is possible for a fabricated memory cell of a NAND flash memory to suffer an operational failure. A block having at least one failed memory cell is considered a "failed block." If the number of failed blocks in a NAND flash memory device is more than a threshold value, e.g., more than five, then the NAND flash memory device is determined to be defective. On the other hand, if the number of failed blocks of the NAND flash memory device is fewer than the threshold number of failed blocks, the device is configured to utilize redundant blocks to replace the bad blocks.

However, conventional NAND flash memory devices are not capable of utilizing redundant blocks to replace faulty security blocks. The security blocks are specially configured to store security-related data such as the serial number of device manufacturer, the date of manufacture, and other security-related information. If the security block fails, the NAND flash memory device can not be repaired and is considered defective.

SUMMARY OF THE INVENTION

According to one aspect of the present invention, a NAND flash memory device is provided which includes a plurality of main blocks for storing main data, a security block for storing security data, and a plurality of redundancy blocks each for being substituted in place of a failed main block, wherein at least one of the redundancy blocks may selectively substituted in place of a failed main block and a failed security block.

According to another aspect of the present invention, a NAND flash memory device is provided which includes a plurality of main blocks for storing main data, a plurality of redundancy blocks each for being substituted in place of a failed main block, a security block for storing security data, and a security redundancy block for being substituted in place of the security block in the event the security block fails.

According to yet another aspect of the present invention, a method for repairing a NAND flash memory device having a defective security block is provided, where the method includes testing the security block, substituting a security redundancy block in place of the security block when the security block has failed, and testing the security redundancy block.

BRIEF DESCRIPTION OF THE DRAWINGS

The above and other features and advantages of the present invention will become readily apparent from the detailed description that follows, with reference to the accompanying drawings, in which.

DETAILED DESCRIPTION OF THE PREFERRED EMBODIMENTS

Figure 1:
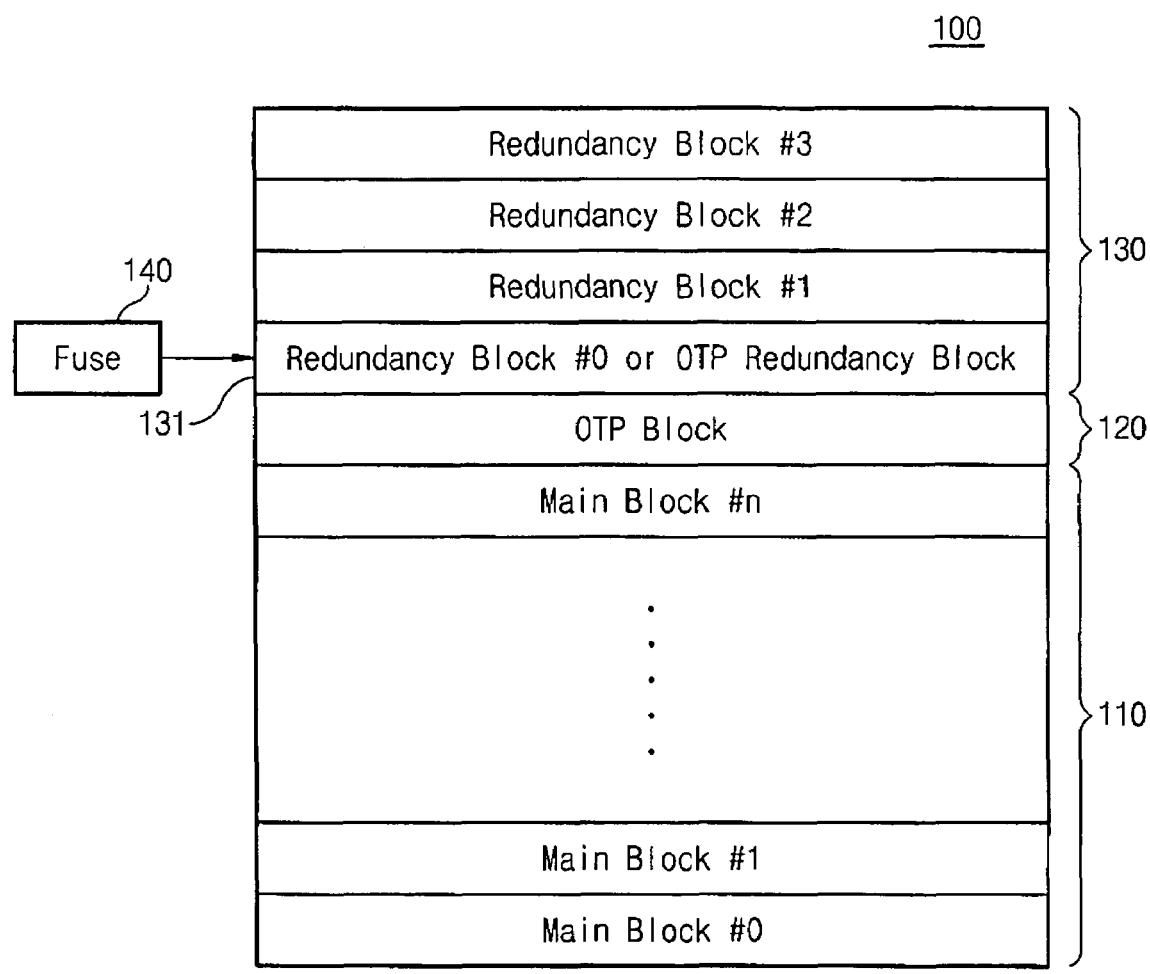
FIG. 1 is a block diagram showing a cell array of a NAND flash memory device according to an embodiment of the present invention.

FIG. 1 is a block diagram of a cell array 100 of a NAND flash memory device according to an embodiment of the present invention. Referring to FIG. 1, the cell array 100 includes a plurality of main blocks 110, at least one "one-time programmable" (OTP) block 120, plural redundancy blocks 130, and a fuse circuit 140. In this example, there are four redundancy blocks 130, but it should be understood the invention is not limited to this particular number of redundancy blocks 130.

The main blocks 110 store main data. In the example of this embodiment, the main data is data which is read or erased by users.

The OTP block 120 is a security block for storing security-related data of the NAND flash memory device. As information processing systems become more complex, users desire the capability of storing, for example, device ID data (e.g., a serial number of a manufacturing company, the date of manufacture) and other security-related data in the memory device. Since the OTP block 120 is capable of being programmed only once, the security data stored the OTP block 120 can not be overwritten (or erased). The security data is thereby safely preserved.

Under control of the fuse circuit 140, when one of the main blocks 110 fails, or when the OTP block 120 fails, one of the redundancy blocks 130 is substituted in place of the failed block. For example, the redundancy block 131 may be substituted for one of the main blocks 110 if a fuse of the fuse circuit 140 is not cut. Alternatively, the redundancy block 131 may be substituted for the OTP block 120 if the fuse of the fuse circuit 140 is cut.

In this embodiment, at least one of the redundancy blocks 130 can function both as a normal redundancy block to be utilized upon failure of a main block 110 and as an OTP redundancy block to be utilized upon failure of the OTP block 130. Whether the redundancy block is a normal redundancy block or an OTP redundancy block is set by the fuse 140. If the fuse circuit 140 is sets the redundancy block as an OTP redundancy block, then the data stored therein is secured in the same manner a normal OTP block.

Figure 2:
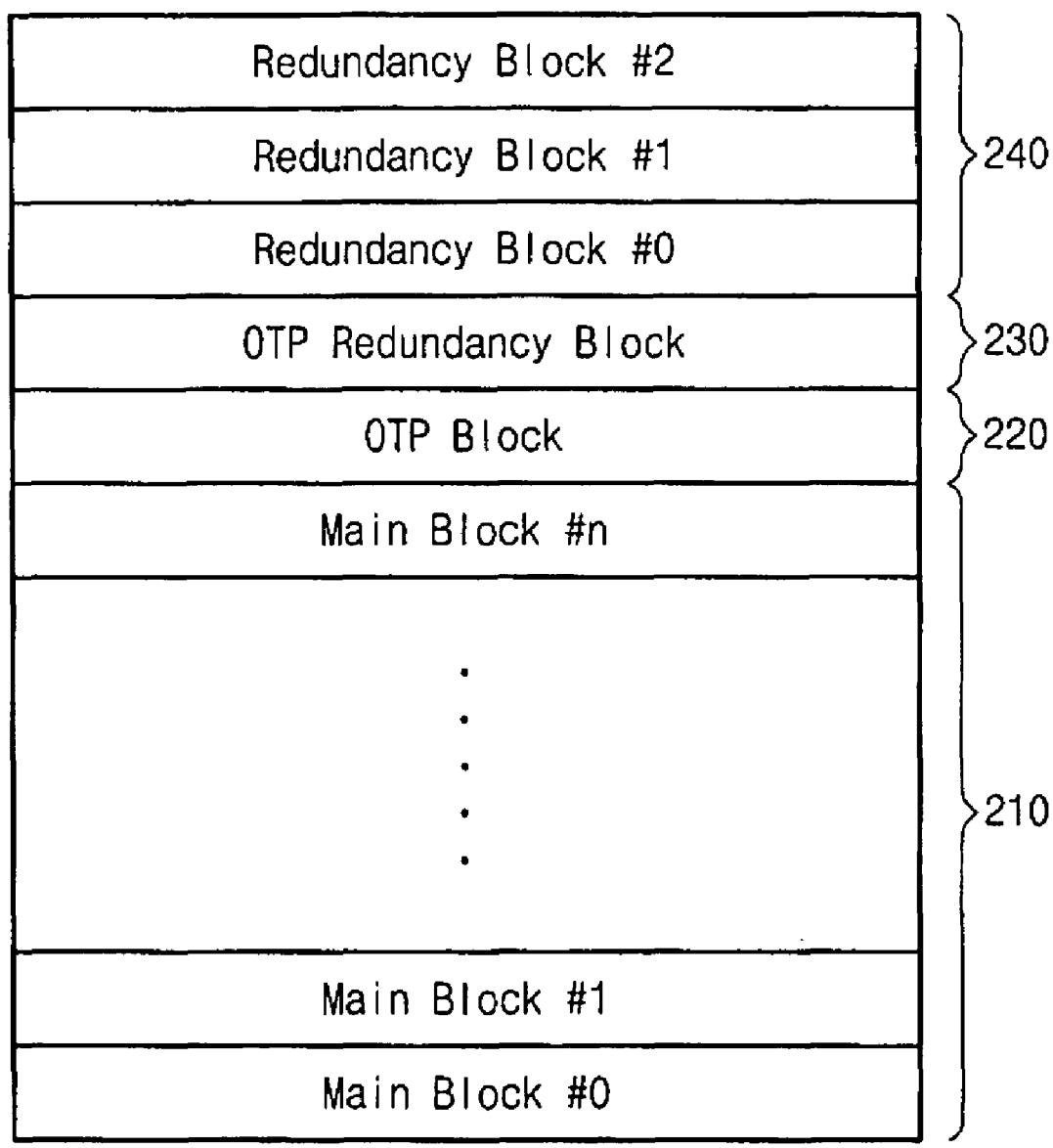
FIG. 2 is a block diagram showing a cell array of a NAND flash memory device according to another embodiment of the present invention.

FIG. 2 is a block diagram showing a cell array 200 of a NAND flash memory device according to another embodiment of the present invention in which a dedicated OTP redundancy block is provided.

Referring to FIG. 2, the cell array 200 includes a plurality of main blocks 210, at least one OTP block 220, at least one OTP redundancy block 230, and plural redundancy blocks 240. In this example, there are three redundancy blocks 130, but it should be understood the invention is not limited to this particular number of redundancy blocks 130.

The main blocks 210 store main data. In the example of this embodiment, the main data is data which is read or erased by users.

The individual blocks among the redundancy blocks 240 are substituted in place of any failed blocks among the main blocks 210. On the other hand, when the OTP block 220 fails, the OTP redundancy block 230 substituted for the failed OTP block 220.

Unlike the memory device in FIG. 1, the NAND flash memory device 200 in FIG. 2 is equipped with a dedicated OTP redundancy block 230 for repairing the OTP block 220. Any data stored in the OTP redundancy block 230 is secured in the same manner as a normal OTP block.

Figure 3:
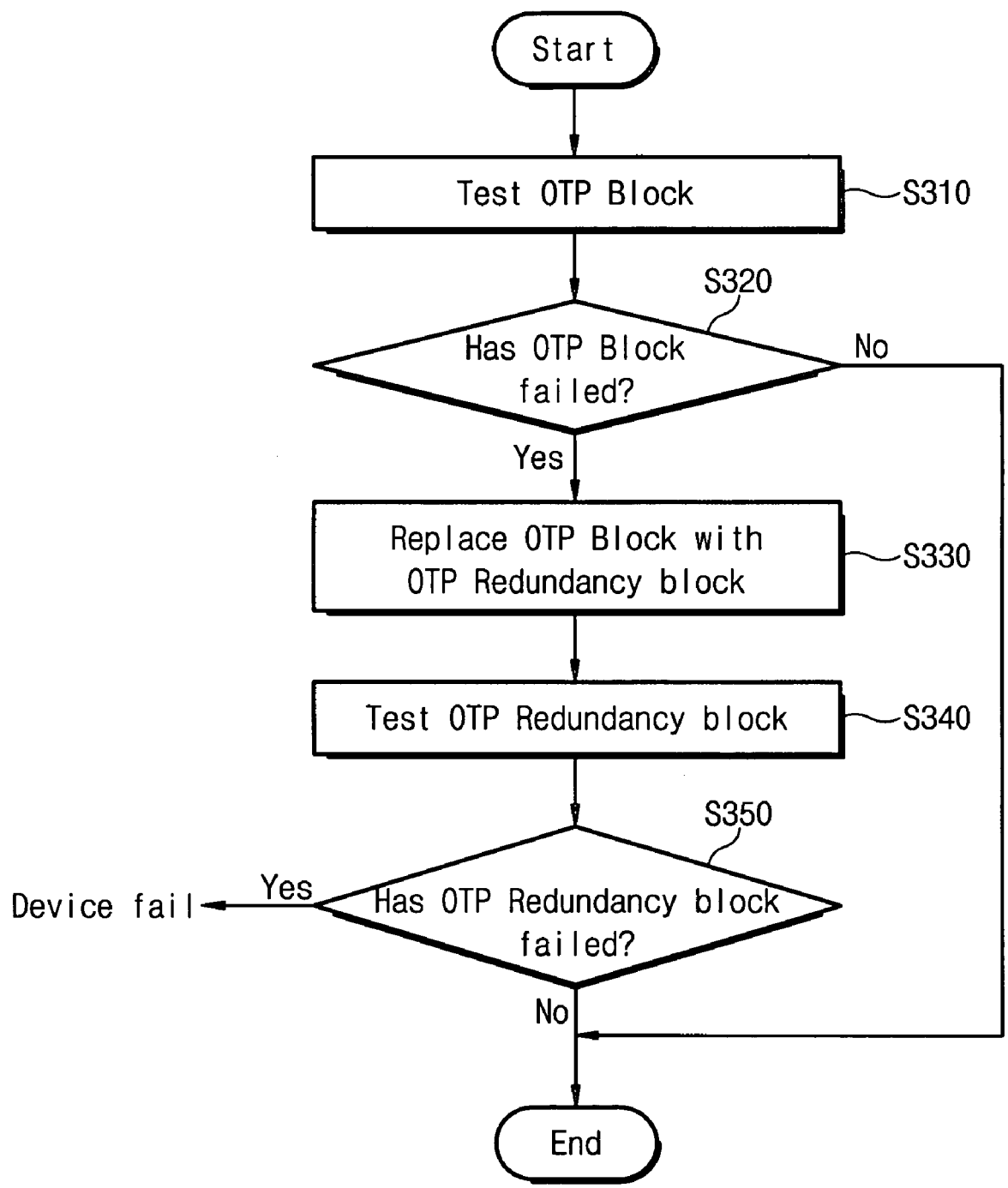
FIG. 3 is a flowchart illustrating a method for repairing a one-time programmable (OTP) block of a NAND flash memory device according to another embodiment of the present invention.

FIG. 3 is a flowchart illustrating a method for repairing the OTP block of the NAND flash memory device according to an embodiment of the present invention, where the OTP block is a security block for storing security data.

First, the OTP block is tested in step S310. In step S320, a determination is made as to whether the OTP block has failed. If it is determined in step S320 that the OTP block has not failed, then the operation for repairing the OTP block ends. Otherwise, the OTP redundancy block is substituted for the OTP block in step S330. In this case, either the fuse-controlled redundancy block 131 of FIG. 1 can be utilized as the OTP redundancy block, or the dedicated redundancy block 230 of FIG. 2 can be utilized as the OTP redundancy block. The OTP redundancy block is then tested in step S340, and in step S350, a determination is made as to whether the OTP redundancy block has failed. If the OTP redundancy block has failed, the NAND flash memory device is discarded. If not, then the operation for repairing the OTP block ends.

In a conventional NAND flash memory device, since there is no redundancy block to substitute for a failed security block (or OTP block), the NAND flash memory device is discarded when the security block fails. That is, a memory device with the failed security block is treated as defective.

In the NAND flash memory device according to embodiments of the present invention, if the security block fails, it is possible to substitute the failed security block using the OTP redundancy block. As such, it may not be necessary to discard the NAND flash memory device and device yields are thereby improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A NAND flash memory device, comprising:
   a plurality of rewritable main blocks for storing main data;
   a primary one-time programmable (OTP) block for storing security data; and,
   a plurality of main redundancy blocks each for being substituted in place of a failed rewritable main block,
   wherein at least one of the main redundancy blocks is responsive to a control signal to operate as a redundant OTP block, and wherein the redundant OTP block is for being substituted in place of the primary OTP block in the event of failure of the primary OTP block.

2. The NAND flash memory device of claim 1, further comprising a fuse circuit which generates the control signal which causes the at least one main redundancy block to operate as the redundant OTP block.

3. The NAND flash memory device of claim 1, further comprising:
   an additional redundant OTP block for being substituted in place of the OTP block in the event the primary OTP block fails.

4. A method for repairing a NAND flash memory device having a defective one-time programmable (OTP) block, the NAND flash memory device including a plurality of rewritable main blocks for storing main data and an OTP block for storing security data, the method comprising:
   substituting one of a plurality of redundancy blocks in place of a failed rewritable main block;
   testing the primary OTP block; and
   substituting at least one of the plurality of redundancy blocks in place of the OTP block when the OTP block has failed.

* * * * *